United States Patent
Kwong

(10) Patent No.: US 6,444,922 B1
(45) Date of Patent: Sep. 3, 2002

(54) ZERO CROSS-TALK SIGNAL LINE DESIGN

(75) Inventor: Herman Kwong, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/443,128

(22) Filed: Nov. 18, 1999

(51) Int. Cl.[7] .......................... H01R 12/04; H05K 1/11
(52) U.S. Cl. ......................... 174/261; 174/51; 174/255
(58) Field of Search ............................... 174/251, 261, 174/262, 51, 255; 361/748, 780

(56) References Cited

U.S. PATENT DOCUMENTS

| | | | | |
|---|---|---|---|---|
| 4,801,905 A | * | 1/1989 | Becker | 333/238 |
| 5,430,933 A | * | 7/1995 | Marx et al. | 29/846 |
| 5,522,132 A | * | 6/1996 | Mattei | 29/846 |
| 5,604,658 A | * | 2/1997 | Pedder | 361/277 |
| 5,677,515 A | * | 10/1997 | Selk et al. | 174/255 |
| 5,828,555 A | * | 10/1998 | Itoh | 361/784 |
| 6,028,489 A | * | 2/2000 | Juang et al. | 331/46 |

* cited by examiner

*Primary Examiner*—Albert W. Paladini
*Assistant Examiner*—Jeremy Norris

(57) ABSTRACT

In printed wiring boards, crosstalk can occur by the electrical coupling between nearby signal lines in a given layer. This source of noise degrades signal quality and is a major limiting factor in communication systems performance, especially at high frequencies. To eliminate crosstalk between copper signal lines in a printed wiring board, a metal shield is formed around each signal trace from the transmit end to the receive end. The metal shield is built from a microstrip or stripline in the printed wiring board by cutting grooves from the surface on both sides of the signal line, through the dielectric material to the underlying ground plane, thereby exposing the ground metal all along the bottom of the channel. Preferably, the grooves are formed using techniques adapted from microvia technology. Metallization is then applied to the top surface and the grooves (side walls and bottom) resulting in the formation of a complete metal shield around the signal line comparable to that of a coaxial cable. The metal shield isolates the signal from radiating any energy or interference to neighboring signal lines, thereby eliminating any potential crosstalks.

22 Claims, 3 Drawing Sheets

ZERO CROSS-TALK SIGNAL LINE DESIGN

FIELD OF THE INVENTION

This invention relates to printed wiring board design and, more particularly, to a method for shielding copper signal lines from radiating electromagnetic energy to neighbouring signals.

BACKGROUND OF THE INVENTION

The past two decades has seen major advances in the performance, size and cost of electronics equipment for all types of end-product applications. Underlying these improvements has been the rapid increase in sophistication of the two most custom elements of an electronics product, namely integrated circuits and printed wiring boards. The printed wiring board no longer serves as the passive interconnection panel that it used to be. In addition to providing for component mounting and interconnection, it has assumed a major role in determining the active functioning of electronic circuits.

In response to the increasing demands for cost-effectively maintaining integrated circuit performance, printed wiring boards have evolved into many different types of packaging and interconnecting structures. To complicate the design process, these printed circuit structures are being implemented with a wide variety and combination of materials and they can also be manufactured by several different processes.

The printed wiring board (PWB) is, in general, a layered dielectric structure with internal and external wiring that allows electronic components to be mechanically supported and electrically connected internally to each other and to the outside environment. Printed wiring boards are the most commonly used packaging medium for electronic circuits and systems.

Copper-clad laminate and prepreg are the basic building blocks of the printed wiring board. Prepreg refers to fabric impregnated with resin in which the resin is partially reacted so that it has the correct properties for use in subsequent operations, whether that be the manufacture of laminates or for use as the bonding sheet for the production of multilayer boards. One or more pieces of prepreg with copper foil on the outside, are laminated under heat and pressure to form the copper-clad laminate. The copper is then patterned using resists and etched. At present, the copper-clad laminates and prepregs are made with a variety of different matrix resin systems and reinforcements. FR-4 laminates, for example, are constructed of multiple plies of epoxy-resin-impregnated woven glass cloth. The dimensional stability of the epoxy-fiberglass is adequate for its use with high density wiring and its availability in a semicured prepreg makes it particularly desirable for rigid multilayer applications. In fact, it is the most widely used material in the printed wiring board industry because its properties satisfy the electrical and mechanical needs of most applications.

The ever increasing packaging density and faster propagation speeds, which stem from the demand for high-performance systems, have forced the evolution of the boards from single-sided to double-sided to multilayer boards. The necessity of a controlled impedance for high-speed traces, the need for bypass capacitors and the need for low inductance values for the power and ground distribution networks have made the requirement of power and ground planes a must in high performance boards. These planes are obviously only possible in multilayer construction.

A printed wiring board is, therefore, generally a composite of organic and inorganic dielectric material with multiple layers. The interconnects or the wires in these layers are connected by 'via' holes, which can be plated with metal to provide the electrical connections between respective layers. In addition to the ground and power planes, used to distribute bias voltages to the ICs and other discrete components, the signal lines are distributed among various layers to provide the interconnections in an optimum manner.

At low frequencies, a signal path on a printed wiring board may be represented electrically as a lumped network of series resistances and shunt capacitances. However, as the frequency is increased, this approach of lumped circuit modelling breaks down, and signal paths must be regarded as transmission lines. The commonly used PWB transmission line structures are microstrip, embedded microstrip, stripline and dual striplines. The microstrip configuration simply refers to the case where the printed wiring board conductor is separated from a reference plane, either ground or power, by a dielectric. The stripline configuration, on the other hand, has reference planes above and below the conductor. A typical multilayer board of more than two signal layers, then, may have both stripline and microstrip geometries.

In general, the properties of importance that need to be minimized for good printed board design are signal delay, distortion and 'crosstalk' noise. Crosstalk is a category of noise induced primarily by the electromagnetic coupling between signal lines. In printed wiring boards, crosstalk can occur by the electrical coupling between nearby signal traces in a given layer. Crosstalk decreases noise margins and degrades signal quality. This, of course, can be a major limiting factor in communication systems performance. Crosstalk increases with longer trace coupling distances, smaller separation between traces, shorter pulse rise and fall times, larger magnitude currents or voltages being switched, and decreases with the use of adjacent power and ground planes or with power and ground traces interlaced between signal traces on the same layer.

The printed wiring board is an essential part of a total electronic circuit packaging system. As more and more functions are integrated on a chip, more connections off the chip are required, and more circuit traces are needed to interconnect them. The need for high density has led to finer conductor lines and closer spacing. With the closeness of the conductors, and higher signal speeds, the coupling of signals into adjacent conductor lines becomes greater and introduces noise and false signals into systems.

Two types of signal coupling determine the amount of crosstalk in a circuit: inductive coupling and capacitive coupling. These two types of coupling decrease with increasing distance between source and receiver. Most crosstalk can be attributed to adjacent wires. Because parallel and adjacent wires on a printed wiring board layer interact both capacitively and inductively, the distance over which adjacent wires are parallel should be minimised. To minimise the crosstalk caused by capacitive coupling, high frequency designs should also incorporate ground planes under each signal layer. Ground planes virtually eliminate the crosstalk caused by capacitive coupling between adjacent layers. Ideally, then, crosstalk between neighboring signals can be reduced by maximizing signal-to-signal spacing and by minimizing signal-to-ground distances.

However, as mentioned, crosstalk is also a problem at high frequencies because, as operating frequencies increase, signal wavelengths become comparable to the length of some of the interconnections on the printed wiring board. Under these conditions and depending on the degree of inductive and capacitive coupling, the interconnections may actually become antennas and begin broadcasting.

These factors, plus a host of others, contain many interdependencies and are often at odds with one another. For example, high wiring density is required to minimize interconnect delays as well as size, cost and weight. However, as signal lines are placed closer together, their mutual coupling increases, with a corresponding rise in crosstalk levels.

Therefore, the design of PWBs has become quite a challenging task, especially when designing high-performance and high-density boards. Most significantly, electromagnetic coupling between the interconnects (signal traces) is the primary factor that sets the upper limit to the interconnect density.

SUMMARY OF THE INVENTION

The invention involves the creation of a metal shield around a copper signal line or differential pair in a printed wiring board to isolate the signal(s) from radiating energy to neighboring signals, thus eliminating totally any potential crosstalks. The metal shield is built from a microstrip or stripline configuration in the PWB by scribing, laser ablating, scoring, chemical etching, photolithographic developing, mechanical milling, other chemical and mechanical means of cutting grooves or microchannels from the surface at both sides of the signal trace through the dielectric material (FR4, teflon, getek or any other suitable dielectric) to the ground plane, exposing the ground metal all along the bottom of the channel. Metallisation is then applied to the surface and the grooves (side walls and bottom) by electroless plating, electroplating, immersion plating, chemical vapour deposition, screen printing conductive paste or by other similar processes.

The inventive technique results in a complete shield around the copper signal trace(s) providing for shielding comparable to that of a coaxial cable. This invention is vital for the reliable performance of printed wiring boards at high frequencies. The invention mitigates the deleterious effects caused by the ever-increasing interconnection (signal trace) density of high density and high speed boards and will enable transmissions at speeds greater than 10 GHz with existing copper technology.

The invention, then, is the utilization of printed wiring board fabrication techniques in conjunction with other suitable technologies to form metal shields around copper signal traces in high-speed, high-density boards, thereby eliminating any potential crosstalks. Since the method described involves the use of existing equipment and technologies, an obvious advantage of the invention is that its implementation should not make much difference to the overall system cost. As such, the invention is likely to be critical to the performance of future high-speed products.

Other aspects and features of the present invention will become apparent to those ordinarily skilled in the art upon review of the following description of specific embodiments of the invention in conjunction with the accompanying drawings.

DESCRIPTION OF THE PREFERRED EMBODIMENTS

Figure 1A:
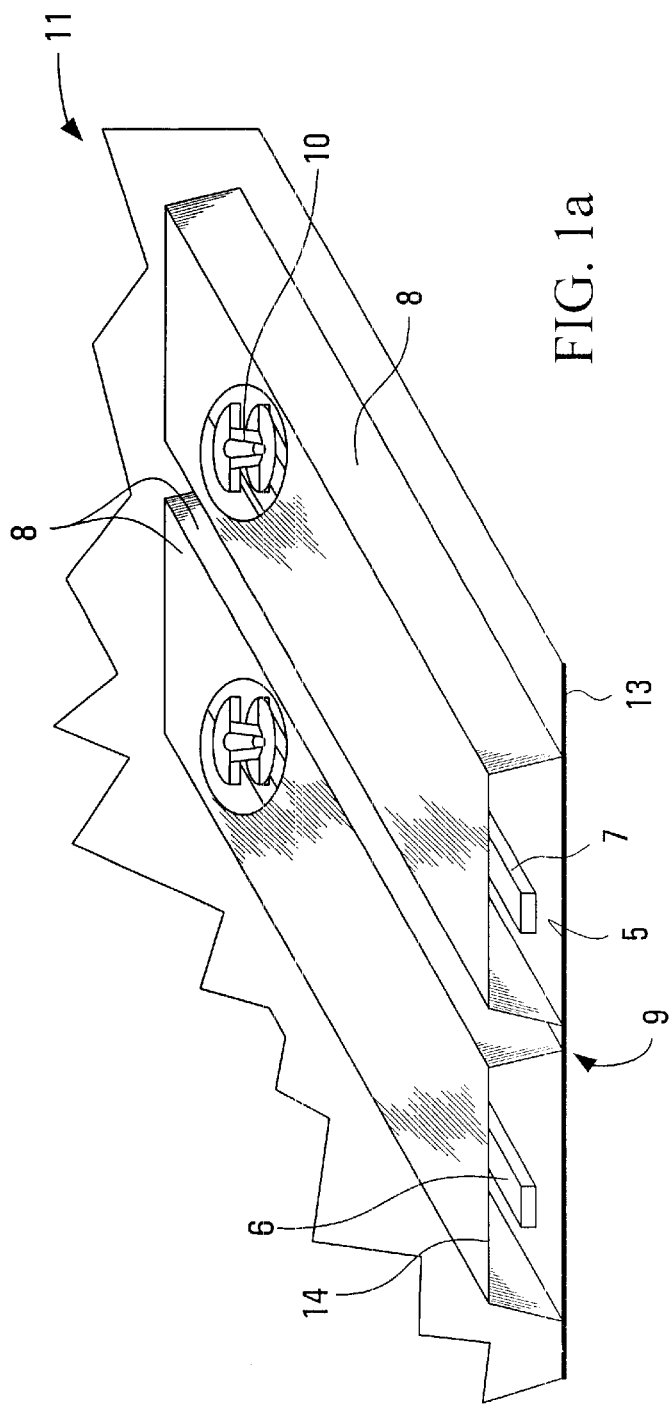
FIG. 1a illustrates a fragmentary perspective view of a printed wiring board incorporating the invention for the case of single-ended copper interconnects.
Figure 1B:
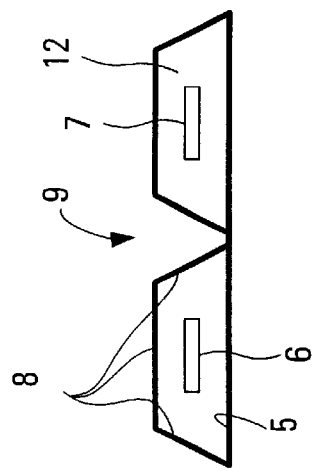
FIG. 1b is a cross-sectional view of FIG. 1a illustrating typical construction dimensions.

Referring to FIGS. 1a and 1b, a printed wiring board (PWB) 11 consists of a dielectric material 12 with a copper ground plane 5 coating a lower surface 13 of the PWB 11. In this embedded microstrip configuration, single-ended copper line traces, only two of which 6 and 7 are shown, are embedded in a plane in the dielectric material 12 and extend parallel to each other and to the upper 14 and lower 13 surfaces of the PWB. A "V-shaped" groove 9, running parallel to the copper line traces 6,7 is provided on both sides of each trace 6, 7 and extends from the upper surface 14 all the way to the lower ground plane 5. In FIGS. 1a and 1b only one complete groove 9 is illustrated, namely the one between signal traces 6 and 7. The grooves 9 extend along the entire length of the copper line traces and are located equidistantly between the individual traces. The upper surface 14 to the PWB 11 is provided with a copper coating 8 which extends along the surfaces of the grooves 9 and into contact with the ground plane 5. Together with the ground plane 5, copper coating 8 forms a complete shield around each signal trace. Via-in-pads 10 for connecting the copper line traces to the upper surface 14 of the PWB 11 are also shown for completeness.

The grooves 9 can be formed from a microstrip or stripline configuration in the printed wiring board using various techniques including laser ablation, scoring, chemical etching, photolithography, mechanical milling or any other suitable chemical or mechanical means. Generally, various techniques employed for via hole formation may be adapted to facilitate implementation of the invention. In particular, current microvia formation techniques are very well suited for creating the grooves. Microvias are a developing technology that differ mainly in the techniques for producing the via holes for small, blind vias. The resulting vias are commonly used in multilayer printed wiring boards. They are increasingly required where the density is higher and less board surface is available for holes, conductors and lands. The depth of these holes is usually limited by the plating aspect ratio, defined as the ratio of hole or drill depth to via size before metallisation. The higher the aspect ratio, the more difficult the hole will be to metallise.

Three prominent processes are available for producing microvias to interconnect the surface layers to the desired buried layer. These methods may be extended by one ordinarily skilled in the art to mass blind via (or 'groove') creation, as described below.

The first method, known as the 'photoimageable dielectric (PID)' technique, produces grooves in surface layers of photoimageable dielectric (PID) by the mask, image and develop process. Microvia or top surface dielectric layers are initially created by the lamination or coating of PID onto a backbone substrate with its surface copper pre-patterned according to manufacturing and design requirements (e.g. through-hole vias plugged and pads required to connect inner layers to outer layers exposed). Photolithographic techniques are then applied to the microvia dielectric layer to expose the interconnecting pads lying immediately underneath.

Metallisation (e.g. electroless and electrolytic copper plating) follows to create a conductive layer in the vias and on the surface of the board. Image-and-etch techniques are then employed to create the desired signal patterns. After a second layer of PID is applied onto the surface, photolithographic techniques are employed to create the grooves. Finally, electroless and electrolytic copper plating are used to form a conductive layer in the grooves and on the surface of the board.

On the other hand, the 'plasma-etched' method employs resin-coated foils with coatings of unreinforced resin. In this case, the microvia layer is created by the sequential lamination of resin coated foil onto the surface of a core substrate which has a microstrip or dual microstrip already built on top a layer of pure epoxy dielectric. An image-and-etch patterning process then defines the location(s) of the groove (s) on the top copper surface. The resulting structure is subjected to plasma to remove the resin between the via's opening and the internal land or ground plane. Finally, metallisation (e.g. electroless and electrolytic copper plating) creates a conductive surface in the groove(s) between the top surface and ground plane, thus forming a complete e.m.i. shield around the signal or pair of signals.

The plasma-etched and PID processes produce vias with slanted walls. Consequently, these techniques result in the formation of the "V-shaped" groove structure illustrated in FIGS. 1a and 1b. However, the third method of groove formation, namely high-speed laser drilling, produces holes with the straightest via barrel (i.e. of square-shaped cross section). Via holes are drilled through the surface copper and glass/resin layers and terminated at the underlying ground plane. This technique is preferred because, after metallization, the resulting 'square-shaped' groove will provide for shielding of signal lines closely approximating that of a coaxial cable, which is the primary goal of the invention. Therefore, of the three prominent processes available for mass blind via formation, laser-drilling is preferred. The speed and precision of today's high-powered lasers also make this technology very well suited for groove formation.

Figure 2:
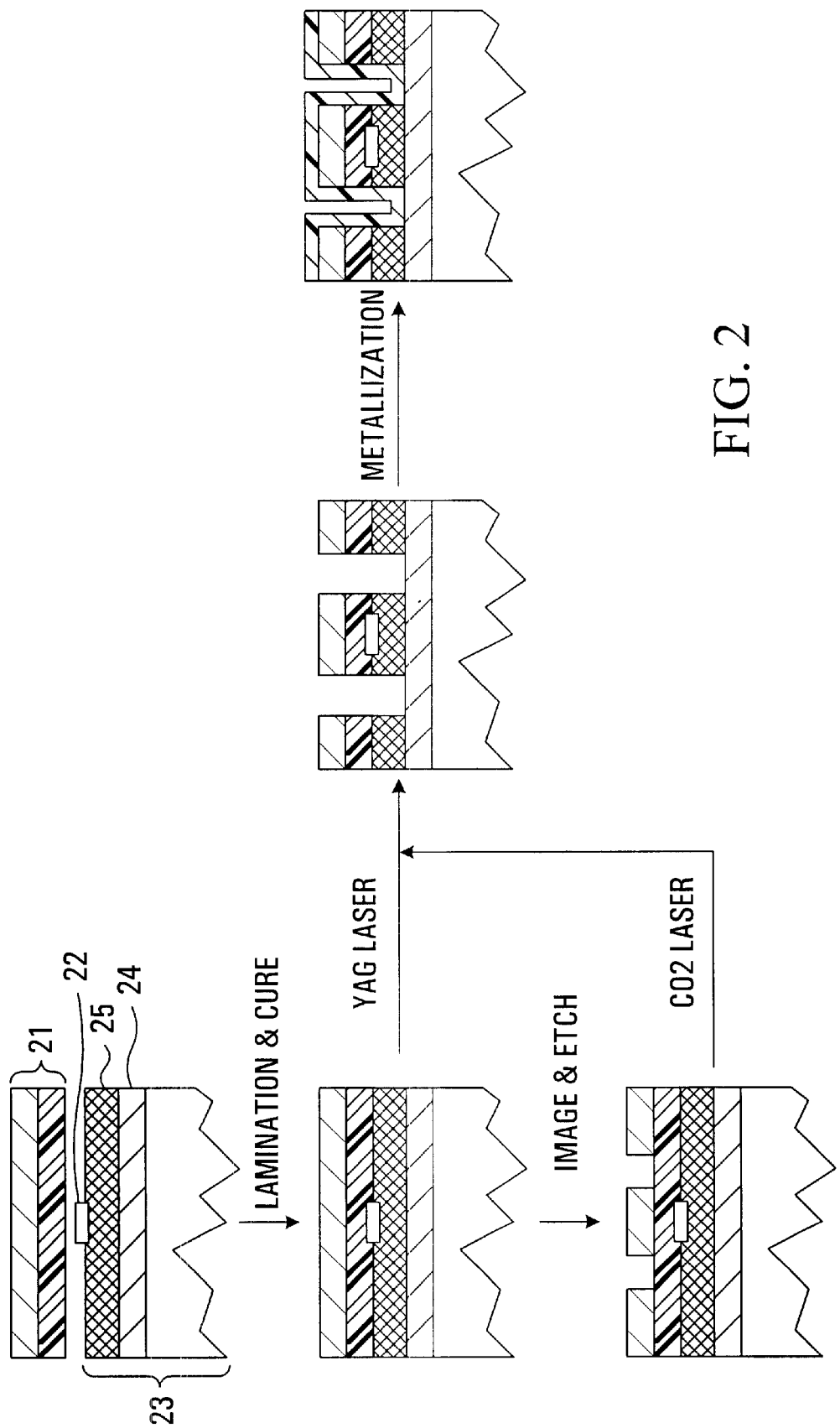
FIG. 2 illustrates the preferred groove forming technique used for creating the metal shields according to the present invention.

FIG. 2 illustrates the laser-drilling technique for creating microvias, an overlapping series of which are drilled to form the grooves on each side of the respective copper line traces. To simplify the discussion, only the top surface layer in a multilayer structure is considered. As per standard practice, resin-coated copper foil 21 (or copper foil with prepreg) is laminated onto a PWB backbone substrate 23 (which may include the previously laminated layers of a multilayer board) containing a ground plane 24 and a microstrip (signal line) 22 built on top of a layer of dielectric 25. A high-speed laser is then used to drill a series of overlapping microvias along the entire length of the signal line (on each side) to form the grooves, thereby exposing the ground metal all along the bottom of the channel. If a YAG (yttrium-aluminium garnet) laser is available, the microvias can be drilled directly from the top copper foil surface 21 through the dielectric 25 to the underlying ground plane 24, since this type of laser is capable of cutting through most materials including epoxy, glass, and copper. After drilling, a plasma-etch or permanganate cleaning process is used to clean and smooth out the groove(s). Standard metallization techniques (e.g. electroless and electrolytic copper plating) are then applied to the surface and groove(s) resulting in a complete metal shield around the copper signal line 22.

If, however, only a CO2 laser is available, the desired groove pattern must be initially formed on the top copper foil surface 21 using suitable "image-and-etch" techniques known in the art. CO2 laser radiation is absorbed by both glass and epoxy but cannot cut through copper and, therefore, it is necessary to use print-and-etch techniques to pattern and strip away the copper first. The CO2 laser is then used to drill through the dielectric 25 to the underlying ground plane 24. Once again, the groove is completed using suitable cleaning and plating processes known in the art. As mentioned previously, microvia hole formation through laser-drilling techniques can produce the straightest via barrel with virtually vertical walls. This results in grooves with a near square-like cross section, a highly desirable trait for the reasons mentioned earlier.

Therefore, the grooves 9 in FIGS. 1a and 1b can be formed using any suitable technique and extend from the top surface 14 at both sides of a signal trace, through the dielectric material (FR4, teflon, or any other suitable dielectric) 12 to the underlying ground plane 5, exposing the ground metal all along the bottom of the channel. Metallization is then applied to the surface and the grooves (side walls and bottom) resulting in the formation of complete metal shields around the individual copper line traces. The metal shield around a signal trace isolates the respective signal from radiating energy or being subjected to interference from neighboring signals, thereby eliminating totally any potential crosstalk. Ideally, the signal isolation provided for by the invention should be comparable to that which may be achieved with standard coaxial cable.

Figure 3A:
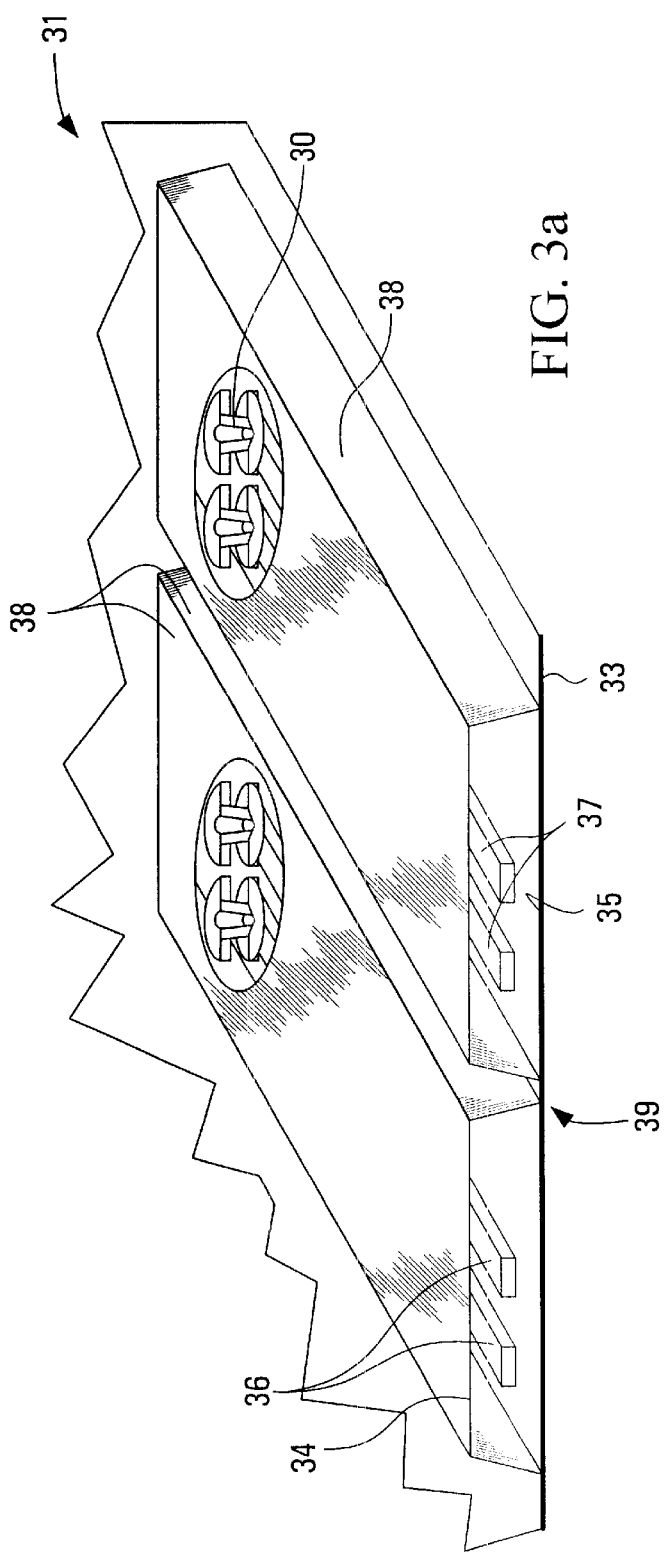
FIG. 3a illustrates a fragmentary perspective view of a printed wiring board incorporating the invention for the case of differential pairs of copper interconnects.
Figure 3B:
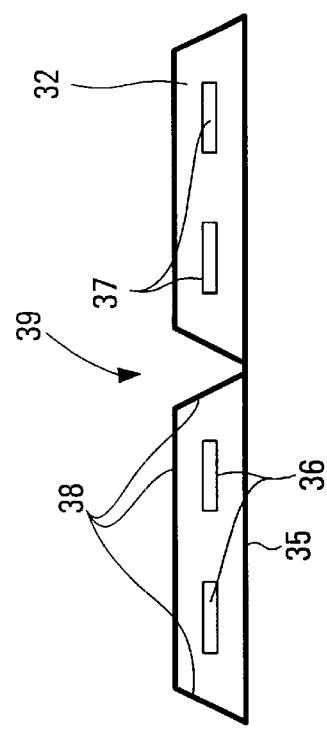
FIG. 3b is a cross-sectional view of FIG. 3a illustrating typical construction dimensions.

FIGS. 3a and 3b illustrate the invention for the case of differential pairs of copper line traces 36, 37. Again, the board 31 is comprised of a dielectric material 32 with a conductive ground plane 35 coating the lower surface. The implementation is identical to that of FIGS. 1a and 1b except that a groove 39 is now formed between each differential pair of copper line traces 36, 37. Plated copper shields 38 surround each differential pair and, together with ground plane 35, form a complete shield around each differential pair of signal lines. In addition to the edge-coupled representation depicted in FIGS. 3a and 3b, the invention may similarly be implemented with differential line pairs that are broadside-coupled.

In most cases, a groove will be cut on each side of a signal trace (or pair of traces with reference to the embodiment of FIG. 3). It should be noted, however, that where signal lines are located along and run parallel to the edge of a board, grooves may be located only on the side of the traces remote from the edge and an edge-plating process (i.e. metallisation of the board edge) may then serve to complete the shielding enclosure.

The preferred embodiments described in the above specification illustrate the invention for the ideal case of totally eliminating crosstalk between signal lines in a PWB. The goal of the invention is to provide a measure of signal isolation comparable to that which can be achieved with coaxial cable. As such, the structure consisting of a metal enclosure around a signal trace should be as close as possible to that of a coaxial cable. Therefore, in order that the signal lines be centered within the enclosure (as in a coaxial cable), the grooves are located equidistantly between signal traces in FIGS. 1 and 3. The grooves also contact the ground plane 5, 31 enabling the formation of complete enclosures around signal lines after metallisation.

However, slight deviations from the preferred embodiments may still provide for a reasonable measure of crosstalk reduction. For example, it is not absolutely essential that the grooves be cut all the way to the underlying ground plane. Although this is necessary to achieve complete enclosures around respective signal lines, any depth of groove which facilitates the formation of a partial metal shield around a signal line will still provide some measure of crosstalk reduction. Also, grooves spanning only portions of a signal trace (for example, in regions of high density) as opposed to the entire length of a line are quite feasible and will, likewise, also provide some reduction in crosstalk levels. In addition, although it is preferable that the grooves be located equidistantly between signal traces (in order that a structure as close to an ideal coaxial cable be achieved), this is not absolutely essential. That is, any form of non-ideal coaxial shielding will still serve to reduce the level of crosstalk.

It should also be stressed that the present invention is not restricted to any specific type of printed wiring board but may well be equally applied to single-sided, double-sided or multilayer boards. For high-density, high-speed logic applications, the use of multilayer boards is almost mandatory, and printed circuit boards with 10 layers or more, including signal planes and power supply planes, are common in most complex systems.

A typical multilayer printed circuit board of more than two signal layers may have both stripline and microstrip geometries. Conventional multilayer boards are made with "print-and-etch" inner layers. Buried or blind vias are formed by fabricating two-sided plated-through holes (PTHs) with thin inner layer material, filling the holes with epoxy resin and then laminating the PTH layers together as if they were regular print-and-etch layers. With respect to incorporation of the invention in multilayer construction, the grooves or micro-channels would be cut and metallized for the individual inner layers before sequential lamination with other signal layers takes place. On a similar note, the grooves and the corresponding shielding enclosures afforded by them, may be realized on both sides (primary and secondary) of a multilayer PWB.

The described invention will be vital for the reliable performance of printed wiring boards at high frequencies. It will mitigate the deleterious effects caused by the ever-increasing interconnection (signal trace) density of high-density and high-speed boards and will enable transmissions at speeds greater than 10 GHz with existing copper technology. Since the invention involves the use of presently available equipment and technologies, an obvious advantage will be that its implementation should not make much difference to the overall system cost. In addition, the shielding enclosure of the invention may permit the otherwise questionable use of low dielectric materials such as pure Teflon. For critical high-speed systems in which system performance and speed of are prime concern, low dielectric materials can increase the line propagation speed by approximately 25 percent compared with epoxy-glass. However, because of their non-sticking property, such materials would otherwise peel off from the metal if not constrained by the shielding enclosure. As such, the invention is likely to be critical to the reliable performance of future high-density, high-speed products.

While preferred embodiments of the invention have been described and illustrated, it will be apparent to one skilled in the art that numerous modifications, variations and adaptations may be made without departing from the scope of the invention as defined in the claims appended hereto.

What is claimed is:

1. A printed wiring board (PWB) comprising a substrate formed of at least one layer of dielectric material having two opposite major surfaces, at least one signal line embedded in the layer and extending generally parallel to the two major surfaces, a first one of the major surfaces being planar and supporting a ground plane, a second one of the major surfaces having at least one groove extending only partially through the PWB and at least partially towards the first major surface and running substantially parallel to the signal line, and a conductive coating on the second major surface and extending into the at least one groove thereby to provide at least partial e.m.i. shielding for the at least one signal line, wherein the at least one signal line is located proximate an edge of the layer and extends substantially parallel to the edge, the groove being located on a side of the signal line remote from the edge, the conductive coating extending over the edge.

2. A PWB according to claim 1, wherein the groove intersects the first major surface and the conductive coating in the groove contacts the ground plane.

3. A PWB according to claim 2, wherein the groove extends substantially the entire length of the signal line.

4. A PWB according to claim 2, wherein the at least one signal line is located proximate on edge of the layer and extends substantially parallel to the edge, the groove being located on a side of the signal line remote from the edge, the conductive coating extending over the edge and into contact with the ground plane.

5. A PWB according to claim 4, wherein the groove extends substantially the entire length of the signal line.

6. A PWB according to claim 1, wherein there is a groove on each side of the signal line, each groove extending at least partially towards the front major surface and running substantially parallel to the signal line, and the conductive coating on the second major surface extending into both grooves.

7. A PWB according to claim 6, wherein each groove intersects the first major surface and the conductive coating in the grooves contact the ground plane.

8. A PWB according to claim 7, wherein each groove extends substantially the entire length of the signal line.

9. A PWB according to claim 1, wherein there is a plurality of signal lines embedded in a plane of the layer, the signal lines being in parallel spaced relation to one another, and wherein there is a groove located between each pair of signal lines, each groove extending at least partially towards the first major surface and running substantially parallel to the signal lines, and a conductive coating on the second major surface and extending into the grooves thereby to provide at least partial e.m.i. shielding for the plurality of signal lines.

10. A PWB according to claim 9, wherein the grooves intersect the first major surface and the conductive coating in the grooves contacts the ground plane.

11. A PWB according to claim 10, wherein the grooves extend substantially the entire length of the signal lines.

12. A printed wiring board (PWB) comprising a substrate formed of a plurality of layers of dielectric material, at least two of the layers each having two opposite major surfaces, a plurality of differential pairs of signal lines embedded in a plane of the respective one of the two layers, the differential pairs of signal lines in a layer being in parallel spaced relation to one another and extending generally parallel to the two major surfaces of the respective layer, a first one of the major surfaces of each of the two layers being planar and supporting a ground plane, the second major surface of each of the two layers having at least one groove extending between adjacent sets of differential pairs of signal lines and only partially through the PWB and at least partially towards its first major surface and running substantially parallel to and proximate the respective sets of differential pairs of signal lines, and a conductive coating on the second major surface of each of the two layers and extending into the at least one groove thereby to provide at least partial e.m.i.

shielding for and between the differential pairs of signal lines in each of the two layers.

13. A printed wiring board (PWB) comprising a substrate formed of at least one layer of dielectric material having two opposite major surfaces, at least one pair of signal lines embedded in the layer and extending generally parallel to the two major surfaces, a first one of the major surfaces being planar and supporting a ground plane, a second one of the major surfaces having at least one groove extending only partially through the PWB and at least partially towards the first major surface and running substantially parallel to a pair of signal lines, and a conductive coating on the second major surface and extending into the at least one groove thereby to provide at least partial e.m.i. shielding for the at least one pair of signal lines, wherein the at least one pair of signal lines is located proximate an edge of the layer and extends substantially parallel to the edge, the groove being located on a side of the pair of signal lines remote from the edge, the conductive coating extending over the edge.

14. A PWB according to claim 13, wherein the groove intersects the first major surface and the conductive coating in the groove contacts the ground plane.

15. A PWB according to claim 14, wherein the groove extends substantially the entire length of the pair of signal lines.

16. A PWB according to claim 14, wherein the at least one pair of signal lines is located proximate on edge of the layer and extends substantially parallel to the edge, the groove being located on a side of the pair of signal lines remote from the edge, the conductive coating extending over the edge and into contact with the ground plane.

17. A PWB according to claim 16, wherein the groove extends substantially the entire length of the pair of signal lines.

18. A PWB according to claim 13, wherein there is a groove on each side of the pair of signal lines, each groove extending at least partially towards the front major surface and running substantially parallel to the pair of signal lines, and the conductive coating on the second major surface extending into both grooves.

19. A PWB according to claim 18, wherein each groove intersects the first major surface and the conductive coating in the grooves contact the ground plane.

20. A PWB according to claim 18, wherein each groove extends substantially the entire length of the pair of signal lines.

21. A PWB according to claim 13, wherein there is a plurality of pairs of signal lines embedded in a plane of the layer, the pairs of signal lines being in parallel spaced relation to one another, and wherein there is a groove located between each two pairs of signal lines, each groove extending at least partially towards the first major surface and running substantially parallel to the signal lines, and a conductive coating on the second major surface and extending into the grooves thereby to provide at least partial e.m.i. shielding for the plurality of pairs of signal lines.

22. A method of making a shielded printed wiring board (PWB), comprising providing a layer of dielectric material having two opposite major planar surfaces and at least one signal line embedded in the layer, forming a ground plane on a first one of the major surfaces, forming a groove in a second one of the major surfaces, the groove extending only partially through the PWB and at least partially towards the first major surface and running substantially parallel to the signal line, forming a conductive coating on the second major surface including the groove thereby to provide at least partial e.m.i. shielding for the signal line, and forming at least one via-in-pad on the at least one signal line for connecting the at least one signal line through the conductive coating.

* * * * *